(12) United States Patent
Noked

(10) Patent No.: US 12,700,560 B2
(45) Date of Patent: Aug. 4, 2026

(54) COOLED SPUTTERING TARGET FOR ION SOURCE

(71) Applicant: Applied Materials, Inc., Santa Clara, CA (US)

(72) Inventor: Ori Noked, Brookline, MA (US)

(73) Assignee: Applied Materials, Inc., Santa Clara, CA (US)

( * ) Notice: Subject to any disclaimer, the term of this patent is extended or adjusted under 35 U.S.C. 154(b) by 436 days.

(21) Appl. No.: 18/232,169

(22) Filed: Aug. 9, 2023

(65) Prior Publication Data

US 2025/0054722 A1 Feb. 13, 2025

(51) Int. Cl.
| | |
|---|---|
| *H01J 37/08* | (2006.01) |
| *H01J 37/244* | (2006.01) |
| *H01J 37/317* | (2006.01) |

(52) U.S. Cl.
CPC ............ *H01J 37/08* (2013.01); *H01J 37/244* (2013.01); *H01J 37/3171* (2013.01); *H01J 2237/002* (2013.01)

(58) Field of Classification Search
CPC ...... H01J 37/08; H01J 37/302; H01J 37/3171; H01J 37/244; H01J 2237/061; H01J 2237/024; H01J 2237/002; H01J 2237/082; H01J 2237/0835
See application file for complete search history.

(56) References Cited

U.S. PATENT DOCUMENTS

| | | |
|---|---|---|
| 10,497,532 B2 | 12/2019 | Byl et al. |
| 12,020,896 B2 | 6/2024 | Lin et al. |

| | | | |
|---|---|---|---|
| 2003/0183172 A1* | 10/2003 | Povall | C30B 23/066 261/DIG. 65 |
| 2005/0056780 A1 | 3/2005 | Miller et al. | |
| 2009/0014667 A1* | 1/2009 | Hahto | H01J 37/08 250/492.21 |

(Continued)

FOREIGN PATENT DOCUMENTS

| | | |
|---|---|---|
| JP | 6-191815 A | 7/1994 |
| TW | 201628046 A | 8/2016 |

(Continued)

OTHER PUBLICATIONS

Sakamoto et al., Aluminum Nitride Ion Production by a Magnetron Sputtering Type Ion Source with a Temperature Controlled Al Target., 22nd International Conference on Ion Implantation Technology, 4 pages, Sep. 2018.

(Continued)

*Primary Examiner* — Wyatt A Stoffa
*Assistant Examiner* — Hsien C Tsai
(74) *Attorney, Agent, or Firm* — Nields, Lemack & Frame, LLC

(57) ABSTRACT

An ion source with a target holder for holding a solid dopant material is disclosed. The target holder is mounted to a shaft, which may be in communication with an actuator, which allows the solid dopant material to be inserted and retracted from the arc chamber. The shaft and/or the target holder is actively cooled such that the solid dopant material remains below its melting point. In this way, the solid dopant material may be inserted into the arc chamber without any melting. The cooling mechanisms used may include gas cooling, liquid cooling, thermoelectric cooling or other cooling techniques.

20 Claims, 10 Drawing Sheets

(56) References Cited

U.S. PATENT DOCUMENTS

| | | | | |
|---|---|---|---|---|
| 2019/0145005 A1 * | 5/2019 | Outten | .............. | H01J 37/32422 |
| | | | | 427/569 |
| 2021/0375585 A1 | 12/2021 | Patel et al. | | |
| 2022/0336181 A1 | 10/2022 | Tseng et al. | | |
| 2022/0406554 A1 | 12/2022 | Wright et al. | | |

FOREIGN PATENT DOCUMENTS

| | | | | |
|---|---|---|---|---|
| TW | 202207268 A | 2/2022 | | |
| TW | 202301467 A | 1/2023 | | |
| WO | WO-2008067395 A2 * | 6/2006 | ........... | G01N 27/623 |

OTHER PUBLICATIONS

International Search Report and Written Opinion mailed Nov. 7, 2024 in corresponding PCT application No. PCT/US2024/038648.

* cited by examiner

COOLED SPUTTERING TARGET FOR ION SOURCE

FIELD

Embodiments of the present disclosure relate to an implanter and an ion source, and more particularly, an ion source with a target holder to hold a solid dopant material, wherein the temperature of the dopant material may be maintained below its melting point.

BACKGROUND

Various types of ion sources may be used to create the ions that are used in semiconductor processing equipment. For example, an indirectly heated cathode (IHC) ion source operates by supplying a current to a filament disposed behind a cathode. The filament emits thermionic electrons, which are accelerated toward and heat the cathode, in turn causing the cathode to emit electrons into the arc chamber of the ion source. The cathode is disposed at one end of an arc chamber. A repeller may be disposed on the end of the arc chamber opposite the cathode. The cathode and repeller may be biased so as to repel the electrons, directing them back toward the center of the arc chamber. In some embodiments, a magnetic field is used to further confine the electrons within the arc chamber. A plurality of sides is used to connect the two ends of the arc chamber.

An extraction aperture is disposed along one of these sides, proximate the center of the arc chamber, through which the ions created in the arc chamber may be extracted.

In certain embodiments, it may be desirable to utilize a material that is in solid form as a dopant species. For example, in some systems, it may be desirable to generate ions of aluminum, gallium, indium, magnesium, antimony, tin, lead or a different metal. Typically, crucibles are used to vaporize these metals or metal containing compounds. However, these systems may be limited in the beam current that may be created. Further, use of solid pure dopants may result in melted metal, which may spill into the ion source, or eject uncontrollably because of the vacuum environment. Alternatively, dopant containing materials that include the desired dopant material may be used. However, these materials may introduce unwanted species and reduce the effective desired dopant beam current.

Therefore, an ion source that may be used with solid dopant materials having low melting temperatures, such as certain metals, would be beneficial.

SUMMARY

An ion source with a target holder for holding a solid dopant material is disclosed. The target holder is mounted to a shaft, which may be in communication with an actuator, which allows the solid dopant material to be inserted and retracted from the arc chamber. The shaft is actively cooled such that the solid dopant material remains below its melting point. In this way, the solid dopant material may be inserted into the arc chamber without any melting. The cooling mechanisms used may include air cooling, liquid cooling, thermoelectric or other cooling techniques.

According to one embodiment, an ion source is disclosed. The ion source comprises an arc chamber, comprising a plurality of walls connecting a first end and a second end; a target holder to hold a solid dopant material; a shaft connected to the target holder, to extend the target holder toward the arc chamber; and a cooling system to actively cool the solid dopant material. In some embodiments, the cooling system actively cools the shaft. In some embodiments, the shaft is made from copper and at least a portion of the shaft is covered by a sheath, made of a non-copper material. In some embodiments, the shaft is cooled using a cooling fluid.

In certain embodiments, the shaft includes a hollow cavity comprising an inlet channel and an outlet channel, such that the cooling fluid flows through an interior of the shaft. In certain embodiments, a partition is located within the hollow cavity and separates the inlet channel from the outlet channel. In certain embodiments, the shaft includes two tubes, wherein the hollow cavity defines an outer tube, and an inner tube is disposed within the outer tube and does not extend to a distal end of the shaft, wherein the two tubes form the inlet channel and the outlet channel.

In certain embodiments, the shaft is cooled by flowing a cooling gas toward an exterior of the shaft. In some embodiments, the ion source comprises a cooling tube, in fluid communication with a fluid chiller, and the cooling tube is wrapped around a portion of the shaft. In some embodiments, the ion source comprises a cooling plate affixed to a proximal end of the shaft, and the cooling plate serves as a heat sink. In certain embodiments, channels are disposed in the cooling plate and cooling fluid flows through the cooling plate to maintain the cooling plate within a predetermined temperature range. In some embodiments, the shaft and/or the target holder is actively cooled using heat pumps affixed thereto. In some embodiments, the target holder is actively cooled using a cooling fluid that passes through the target holder.

According to another embodiment, an ion implanter is disclosed. The ion implanter comprises an ion source to generate an ion beam; and one or more beamline components to direct the ion beam toward a workpiece, wherein the ion source comprises: an arc chamber, comprising a plurality of walls connecting a first end and a second end; a target holder to hold a solid dopant material; a shaft connected to the target holder, to extend the target holder toward the arc chamber; and a cooling system to actively cool the solid dopant material. In some embodiments, the ion implanter comprises a thermocouple to measure a temperature of the solid dopant material; and a controller, wherein the controller uses information from the thermocouple to maintain the solid dopant material within a desired temperature range. In certain embodiments, the controller actively cools the shaft to maintain the solid dopant material within the desired temperature range. In certain embodiments, the shaft is cooled by a fluid passing through an interior of the shaft or a fluid passing over an exterior of the shaft, and the controller controls a temperature of the solid dopant material by controlling a rate of flow of the fluid. In certain embodiments, the shaft is cooled by attachment of a cooling plate to a proximal end of the shaft, wherein the controller controls a temperature of the solid dopant material by controlling a temperature of the cooling plate. In some embodiments, the shaft and/or target holder is cooled by attachment of one or more heat pumps, wherein the controller controls a temperature of the solid dopant material by controlling power supplied to the one or more heat pumps. In some embodiments, the target holder is cooled by a fluid passing through an interior of the target holder, wherein the controller controls a temperature of the solid dopant material by controlling a rate of flow of the fluid.

BRIEF DESCRIPTION OF THE FIGURES

For a better understanding of the present disclosure, reference is made to the accompanying drawings, which are incorporated herein by reference and in which.

DETAILED DESCRIPTION

As noted above, at very high temperatures, the solid dopant in an ion source may melt and create unwanted and/or uncontrolled accumulation of dopant in the arc chamber, as well as potential ejection or excursion of the material into the chamber.

Figure 1:
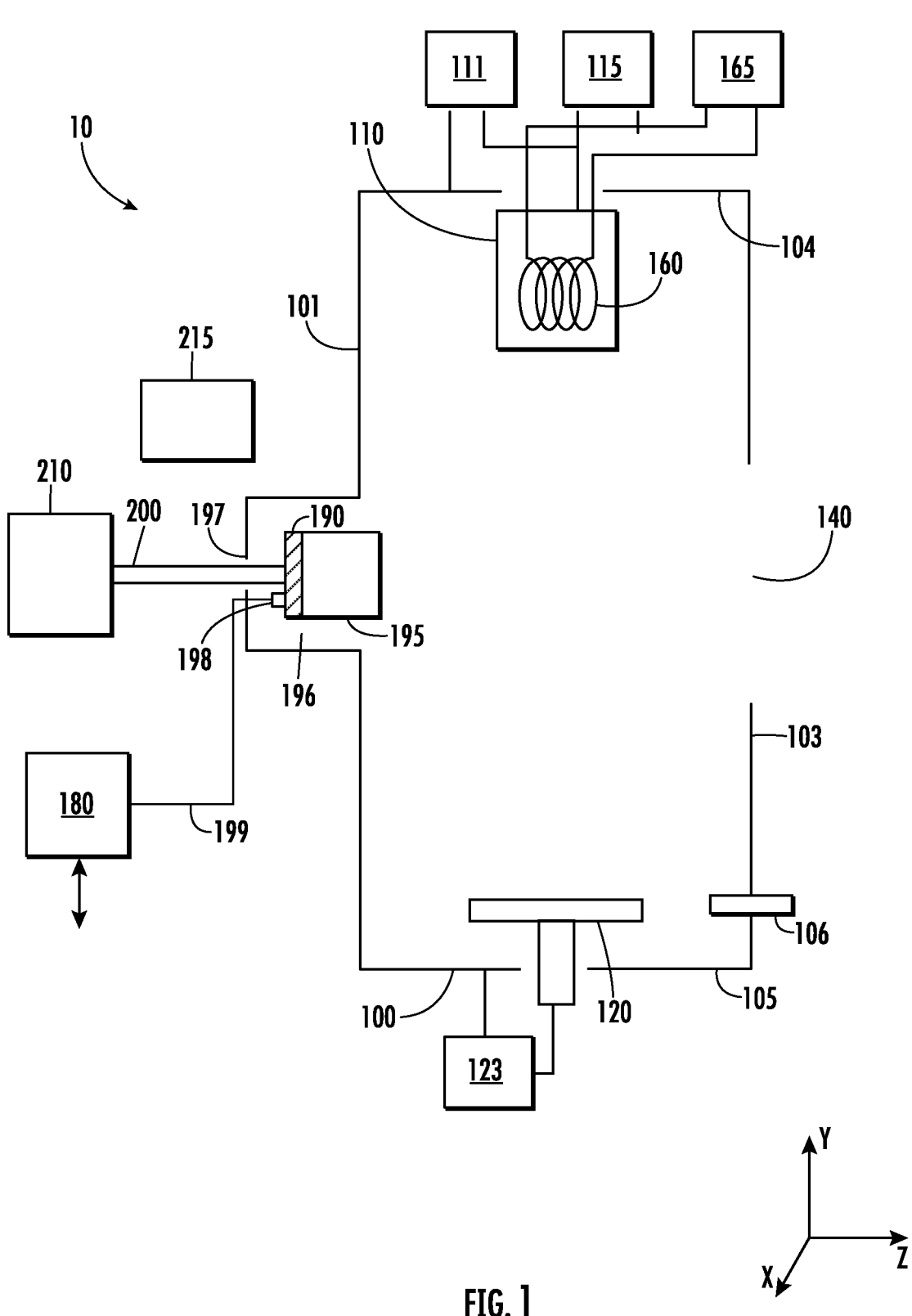
FIG. 1 is an indirectly heated cathode (IHC) ion source with a target holder having a cooling system in accordance with one embodiment.

FIG. 1 shows an ion source, which may be an IHC ion source 10, with a target holder that allows sputtering of a solid dopant material without melting. The IHC ion source 10 includes an arc chamber 100, comprising two opposite ends, and walls 101 connecting to these ends. The walls 101 of the arc chamber 100 may be constructed of an electrically conductive material and may be in electrical communication with one another. In some embodiments, a liner may be disposed proximate one or more of the walls 101. A cathode 110 is disposed in the arc chamber 100 at a first end 104 of the arc chamber 100. A filament 160 is disposed behind the cathode 110. The filament 160 is in communication with a filament power supply 165. The filament power supply 165 is configured to pass a current through the filament 160, such that the filament 160 emits thermionic electrons. Cathode bias power supply 115 biases filament 160 negatively relative to the cathode 110, so these thermionic electrons are accelerated from the filament 160 toward the cathode 110 and heat the cathode 110 when they strike the back surface of cathode 110. The cathode bias power supply 115 may bias the filament 160 so that it has a voltage that is between, for example, 200V to 1500V more negative than the voltage of the cathode 110. The voltage difference between the cathode 110 and the filament 160 may be referred to as cathode bias voltage. The cathode 110 then emits thermionic electrons on its front surface into arc chamber 100.

Thus, the filament power supply 165 supplies a current to the filament 160. The cathode bias power supply 115 biases the filament 160 so that it is more negative than the cathode 110, so that electrons are attracted toward the cathode 110 from the filament 160. In certain embodiments, the cathode 110 may be biased relative to the arc chamber 100, such as by bias power supply 111. The voltage difference between the arc chamber 100 and the cathode 110 may be referred to as arc voltage. In other embodiments, the cathode 110 may be electrically connected to the arc chamber 100, so as to be at the same voltage as the walls 101 of the arc chamber 100. In these embodiments, bias power supply 111 may not be employed and the cathode 110 may be electrically connected to the walls 101 of the arc chamber 100. In certain embodiments, the arc chamber 100 is connected to electrical ground.

On the second end 105, which is opposite the first end 104, a repeller 120 may be disposed. The repeller 120 may be biased relative to the arc chamber 100 by means of a repeller bias power supply 123. In other embodiments, the repeller 120 may be electrically connected to the arc chamber 100, so as to be at the same voltage as the walls 101 of the arc chamber 100. In these embodiments, repeller bias power supply 123 may not be employed and the repeller 120 may be electrically connected to the walls 101 of the arc chamber 100. In some embodiments, the bias power supply 111 may be used to bias the repeller 120. In still other embodiments, a repeller 120 is not employed or may be electrically floating.

The cathode 110 and the repeller 120 are each made of an electrically conductive material, such as a metal or graphite.

In certain embodiments, a magnetic field is generated in the arc chamber 100. This magnetic field is intended to confine the electrons along one direction. The magnetic field typically runs parallel to the walls 101 from the first end 104 to the second end 105. For example, electrons may be confined in a column that is parallel to the direction from the cathode 110 to the repeller 120 (i.e. the y direction). Thus, electrons do not experience any electromagnetic force to move in the y direction. However, movement of the electrons in other directions may experience an electromagnetic force.

Disposed on one side of the arc chamber 100, referred to as the extraction plate 103, may be an extraction aperture 140. In FIG. 1, the extraction aperture 140 is disposed on a side that is parallel to the X-Y plane (perpendicular to the page). Further, the IHC ion source 10 also comprises a gas inlet 106 through which the gas to be ionized may be introduced to the arc chamber 100. In some embodiments, multiple gasses are combined and may enter the arc chamber 100 through the gas inlet 106. In other embodiments, multiple gas inlets may be used to introduce different gasses.

In certain embodiments, a first electrode and a second electrode may be disposed on respective opposite walls 101 of the arc chamber 100, such that the first electrode and the second electrode are within the arc chamber 100 on walls adjacent to the extraction plate 103. The first electrode and the second electrode may each be biased by a respective power supply. In certain embodiments, the first electrode and the second electrode may be in communication with a common power supply. However, in other embodiments, to allow maximum flexibility and ability to tune the output of the IHC ion source 10, the first electrode may be in communication with a first electrode power supply and the second electrode may be in communication with a second electrode power supply.

A controller 180 may be in communication with one or more of the power supplies such that the voltage or current supplied by these power supplies may be modified. The controller 180 may include a processing unit, such as a microcontroller, a personal computer, a special purpose controller, or another suitable processing unit. The controller 180 may also include a non-transitory storage element, such as a semiconductor memory, a magnetic memory, or another suitable memory. This non-transitory storage element may contain instructions and other data that allows the controller 180 to perform the functions described herein.

The IHC ion source 10 also includes a target holder 190, which can be inserted into and retracted from the arc chamber 100. In the embodiment of FIG. 1, the target holder 190 enters the arc chamber along one of the walls 101 of the arc chamber 100. In certain embodiments, the target holder 190 may enter the arc chamber 100 at the midplane between the first end 104 and the second end 105. In another embodiment, the target holder 190 may enter the arc chamber 100 at a location different from the midplane. In the embodiment shown in FIG. 1, the target holder 190 enters the arc chamber 100 through the side opposite the extraction aperture 140. However, in other embodiments, the target holder 190 may enter through the sides that are adjacent to the extraction plate 103. The target holder 190 may move between a first position and a second position.

The target holder 190 includes a first surface that faces toward the arc chamber 100. The solid dopant material 195 may be affixed to the first surface of the target holder 190. The solid dopant material may be a pure metal, such as indium, aluminum, magnesium, antimony, gallium, tin, lead or a different metal, or dopant containing material. The solid dopant material 195 may be in the form of a block of material. In some embodiments, the solid dopant material may be a pure metal, wherein more than 95% of the dopant material comprises the metal. In other embodiments, the solid dopant material 195 may be a compound that contains the dopant material, such as an alloy or a ceramic material. As examples, if aluminum is the desired dopant, the solid dopant material may be pure aluminum, Al—X alloys (where X=B, Cr, Co, Cu, Fe, Mo, Sc, Ti, Zn, Mg, Zr, Dy, Er, Gd, Mn, Nd, Ni, Sm, Ag, Ta, V) or ceramics such as $Al_2O_3$, $AlF_3$, AlN, AlP, $Al_2Se3$, $Al_2S_3$, $Al_2Te_3$, and $Al_2TiO_5$.

In some embodiments, a thermocouple 198 may be in proximity to the target holder 190 or the solid dopant material 195 so as to measure the temperature of the solid dopant material 195. This thermocouple 198 may be in communication with the controller 180. The thermocouple 198 may comprise one or more wires 199 that electrically connect the thermocouple 198 to the controller 180.

The target holder 190 is located at the distal end of a shaft 200. In certain embodiments, the target holder 190 may be a separate component which is affixed to the distal end of the shaft 200. In other embodiments, the target holder may be the distal end of the shaft 200, such that the distal end of the shaft 200 is affixed directly to the solid dopant material 195. In some embodiments, the target holder 190 may have a larger diameter than the rest of the shaft to increase the surface area in contact with the solid dopant material 195.

The shaft 200 may be constructed from a thermally conductive material, such as aluminum, stainless steel, tungsten, copper, or another material.

The proximal end of the shaft 200 may be coupled to an actuator 210. Operation of the actuator 210 allows the target holder 190 to be linearly moved into the arc chamber 100 or retracted from the arc chamber 100. The shaft 200 passes through a vacuum seal 197, such that a first portion of the shaft 200 is disposed within a cavity 196 which is in communication with the arc chamber 100 and a second portion of the shaft is disposed in atmospheric conditions. The length of the first portion and second portion changes based on the position of the target holder 190.

During operation, the filament power supply 165 passes a current through the filament 160, which causes the filament 160 to emit thermionic electrons. These electrons strike the back surface of the cathode 110, which may be more positive than the filament 160, causing the cathode 110 to heat, which in turn causes the cathode 110 to emit electrons into the arc chamber 100. These electrons, under the influence of the magnetic field, collide with the molecules of gas that are fed into the arc chamber 100 through the gas inlet 106. A carrier gas, such as argon, and/or an etching gas, such as nitrogen fluoride or chlorine, may be introduced into the arc chamber 100 through a suitably located gas inlet 106. The combination of electrons from the cathode 110, the gas and the positive potential creates a plasma. In certain embodiments, the electrons and positive ions may be somewhat confined by a magnetic field. In certain embodiments, the plasma is confined near the center of the arc chamber 100, proximate the extraction aperture 140. Chemical etching or physical sputtering by the plasma transforms the solid dopant material 195 into the gas phase and causes ionization. The ionized feed material can then be extracted through the extraction aperture 140 and used to create an ion beam.

Negative ions and neutral atoms that are sputtered or otherwise released from the solid dopant material 195 are attracted toward the plasma, since the plasma is maintained at a more positive voltage than the target holder 190.

The controller 180 may control the actuator 210 such that the outermost surface of the solid dopant material 195 is flush with the wall 101. As the solid dopant material 195 is sputtered, the controller 180 may cause the actuator 210 to translate the shaft 200 so as to extend further toward the arc chamber 100 to maintain the surface of the solid dopant material at this position. In other embodiments, the solid dopant material 195 may extend into the arc chamber 100 to expose more of the solid dopant material 195 to the plasma.

Notably, in some embodiments, the shaft 200 is actively cooled using the cooling system 215. In this way, the temperature of the target holder 190 is reduced due to its physical contact with the cooled shaft. Additionally, since the solid dopant material 195 is in physical contact with the target holder 190, its temperature is likewise reduced by the cooling system 215. In other embodiments, the cooling system 215 actively cools the target holder 190. For example, in certain embodiments, a thermal paste is used to affix the solid dopant material 195 to the first surface of the target holder 190. Further, the shape and/or contour of the first surface of the target holder 190 and the solid dopant material 195 may be configured to maximize the surface area of the target holder 190 that is in contact with the solid dopant material 195.

Figures 2A, 2B, 2C, 2D:
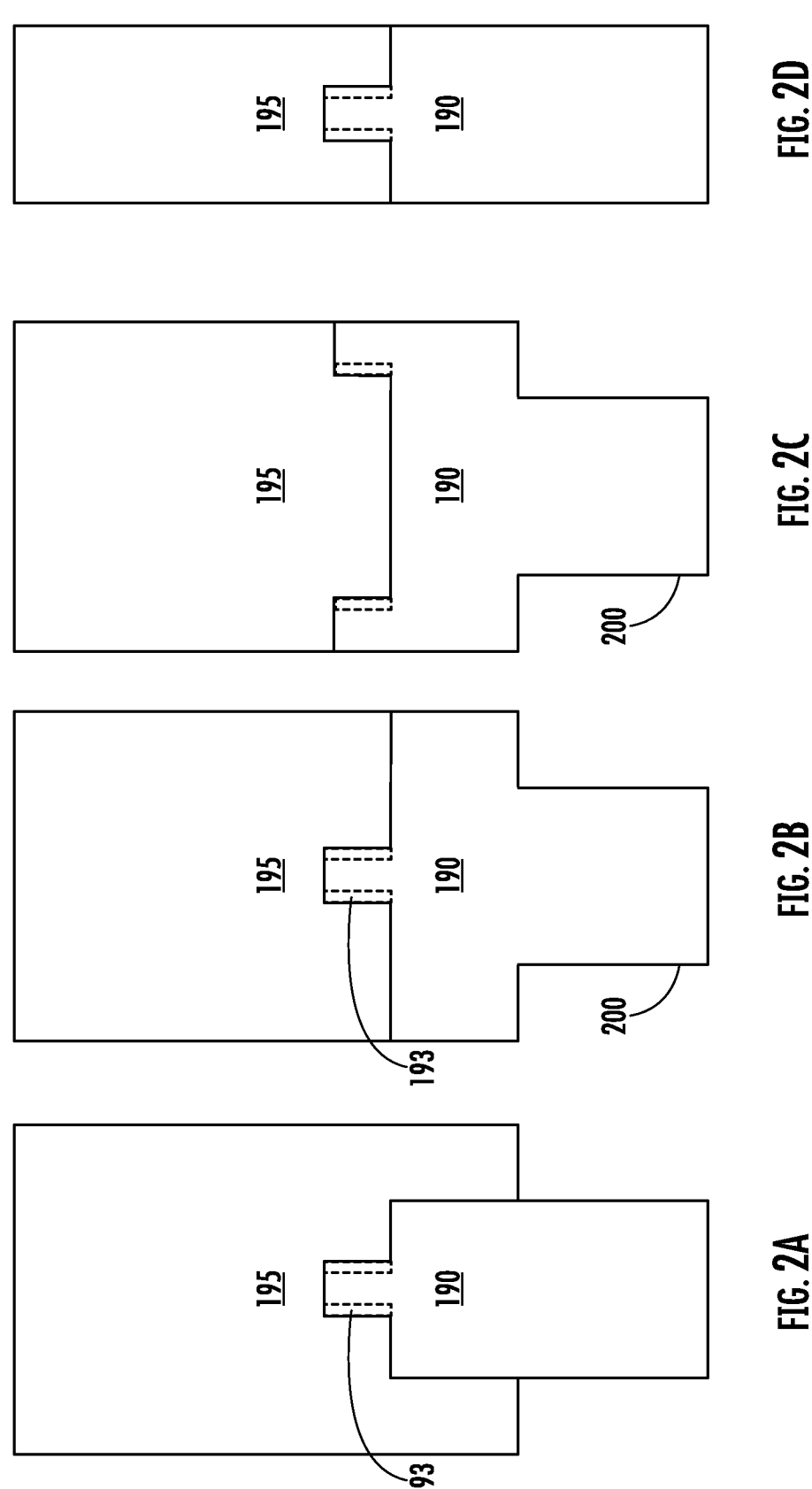
FIGS. 2A-2D show the attachment between the target holder and the solid dopant material according to several embodiments.

For example, FIGS. 2A-2D show various configurations of the target holder 190 and the solid dopant material 195 to increase the surface area of the contact region of these components. In FIG. 2A, the solid dopant material 195 is formed so as to extend over the outer edges of the target holder 190, such that a portion of the solid dopant material surrounds the outer perimeter of target holder 190. Further, one or more protrusions 193 may be created on the first surface of the target holder 190. These protrusions 193 increase the contact region and also provide a more secure attachment. In FIG. 2B, the target holder 190 has a larger diameter than the rest of the shaft 200. This allows a larger volume of solid dopant material 195 to be affixed to the target holder 190, and also creates a larger contact region between these components. One or more protrusions 193 may also be located on the first surface of the target holder 190. FIG. 2C shows an embodiment where the protrusion 193 comprises an annular ring disposed along the outer edge of the first surface. Similar to FIG. 2B, the target holder 190 has a larger diameter than the rest of the shaft 200. Note that the embodiments shown in FIGS. 2B and 2C may be combined such that there are protrusions 193 in the interior of the first surface as well as a protrusion that is located along the outer perimeter. FIG. 2D shows an embodiment that is similar to FIG. 2B. However, in this embodiment, the target holder 190 has the same diameter as the rest of the shaft 200.

As stated above, the shaft 200 or the target holder 190 is actively cooled by the cooling system 215. This may be achieved in a number of different ways.

FIGS. 3A-3G show various embodiments where the shaft 200 is actively cooled. These figures show the shaft 200, which has a first portion located in the cavity 196 and a second portion located in an atmospheric environment, wherein the two portions are separated by the vacuum seal 197. Note that as the shaft 200 is moved, the sizes of the first portion and the second portion vary. The rest of the IHC ion source 10 is as shown in FIG. 1.

Figure 3A:
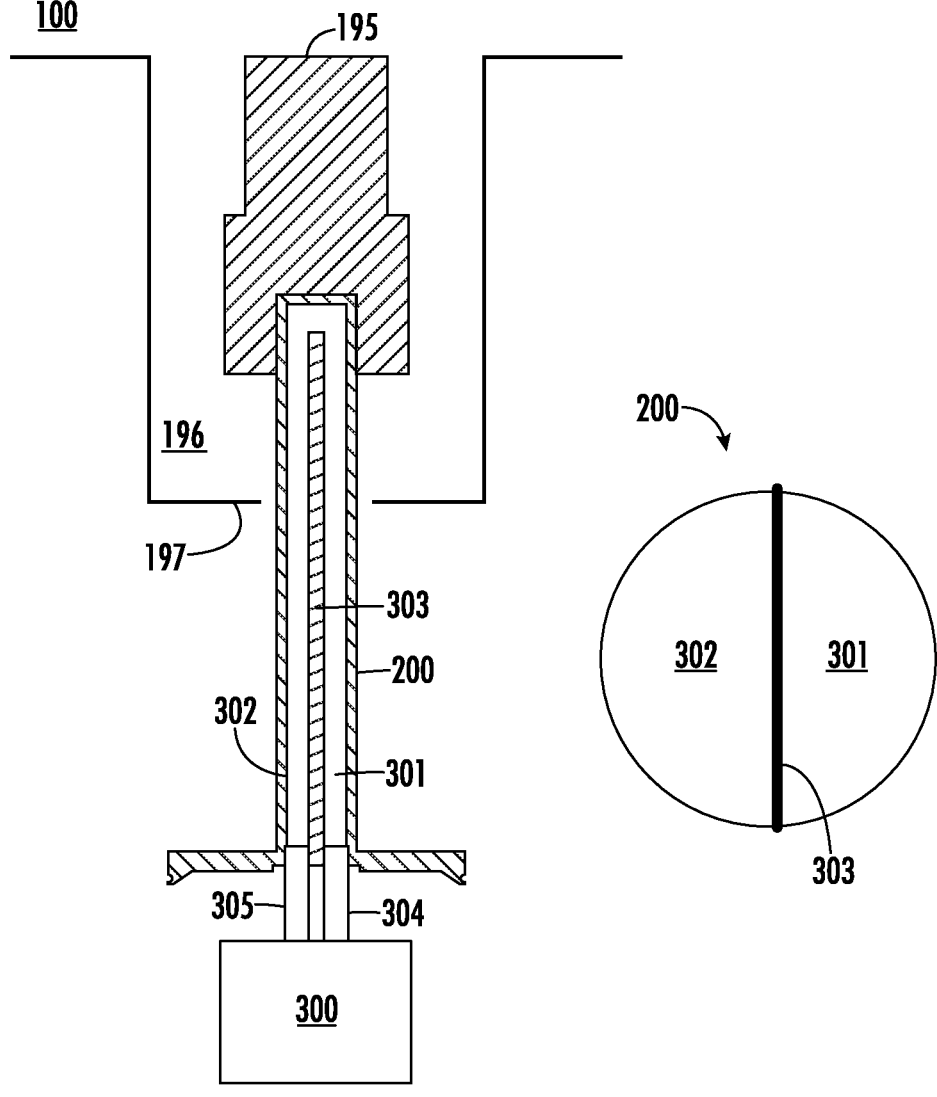
FIGS. 3A-3G show different cooling systems to cool the shaft.

FIG. 3A shows a first embodiment. In this embodiment, cooling channels are formed within the shaft 200. The shaft 200 may be made of a material with suitable mechanical strength, thermal stability and thermal conductance, such as copper, tungsten, stainless steel, aluminum, or another material. Specifically, an inlet channel 301 is disposed in the shaft 200 and may extend to or near the distal end of the shaft 200. A fluid chiller 300 may be used to allow the circulation of a cooling fluid, such as water or gas, through the shaft 200. An outlet channel 302 is also disposed in the shaft 200 and attaches to the inlet channel 301 to allow the flow of a cooling fluid from the fluid chiller 300, through the inlet channel 301, the outlet channel 302 and back into the fluid chiller 300. Conduits 304, 305 may be used to connect the fluid chiller 300 to the inlet channel 301 and the outlet channel 302, respectively. These conduits 304, 305 may be flexible so as to allow the shaft 200 to be translated while the fluid chiller 300 remains stationary.

In one embodiment, shown in FIG. 3A, a large channel is created in the shaft 200 and a partition 303 is inserted to separate the large channel into the inlet channel 301 and the outlet channel 302. A cross-section of this shaft 200 is also shown. In this embodiment, the shaft 200 may be tungsten while the partition 303 is stainless steel.

Figure 3B:
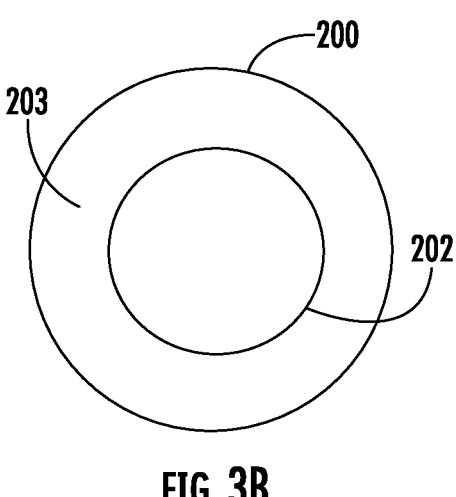

FIG. 3B shows the cross-section of the shaft 200 according to another embodiment that utilizes a cooling fluid. The remainder of the system is as shown in FIG. 3A. In this embodiment, the inlet channel and outlet channel may be implemented using two concentric tubes, with different diameters, wherein the shaft 200 is hollow, and forms the outer tube. The inner tube 202 is located within this outer tube, but does not extend to the distal end of the shaft 200. In this embodiment, cooling fluid flows from the fluid chiller 300 through the inner tube 202 toward the end of the shaft 200 and then flows through the gap 203 between the outer diameter of the inner tube 202 and the inner diameter of the outer tube and back into the fluid chiller 300. Alternatively, the cooling fluid may flow from the fluid chiller 300 through the gap 203 and then through the inner tube 202 and back into the fluid chiller 300.

Note that there may be more than two channels within the shaft 200 if desired. In another embodiment, the shaft 200 with the cooling channels may be formed using additive manufacturing. The cooling fluid may be any suitable fluid, such as deionized water or a cooled gas such as nitrogen or air. In some embodiments, the flow rate of the cooling fluid may be 1 L/min or more. Note that the fluid chiller 300 is disposed in an atmospheric environment, due to vacuum seal 197.

Figure 3C:
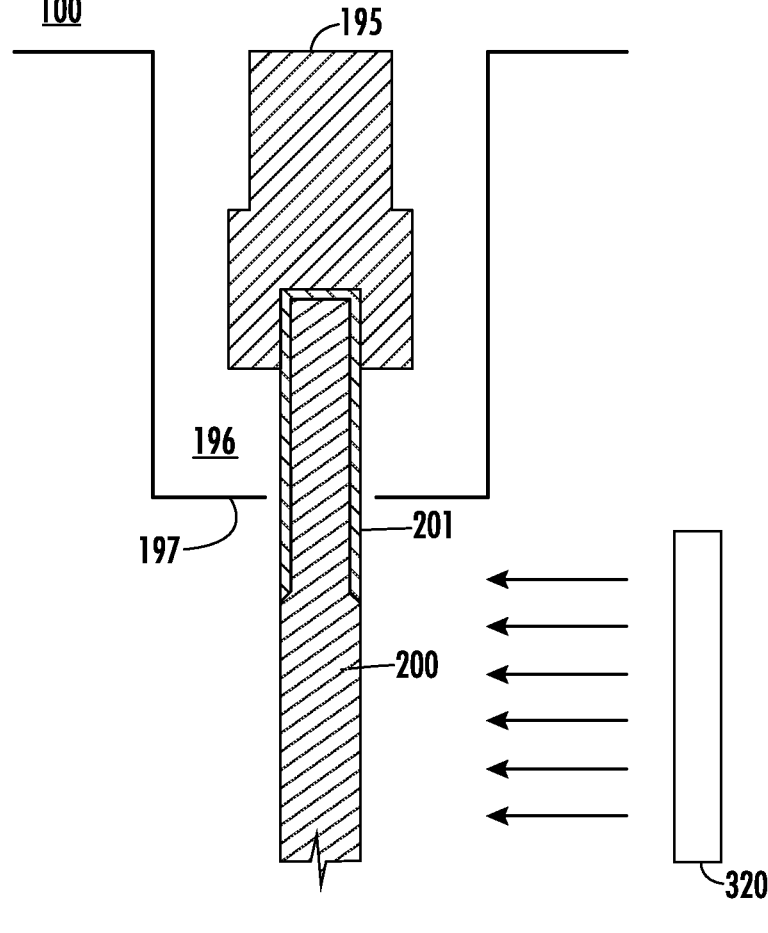
Figure 3D:
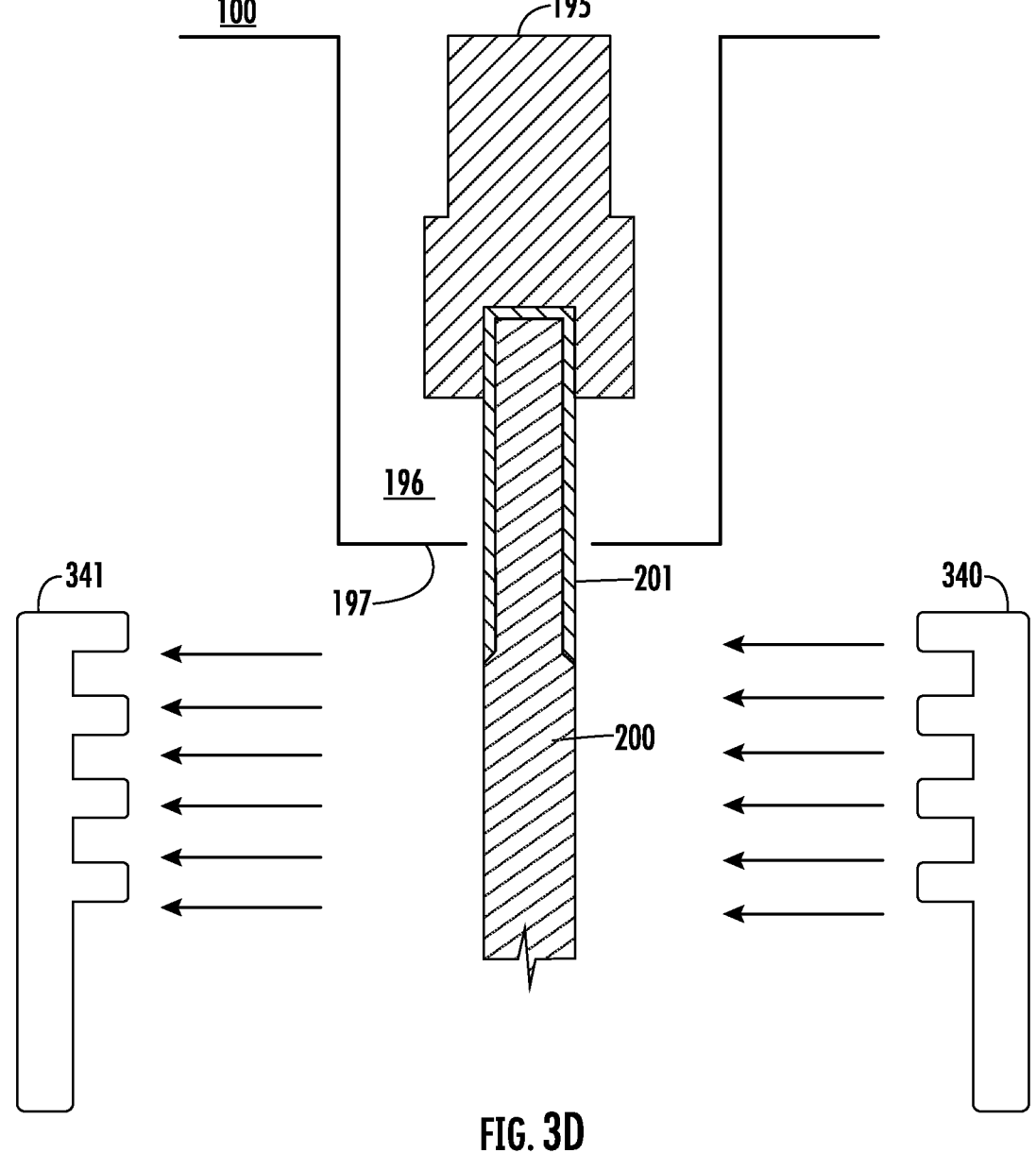

FIG. 3C shows a second embodiment. In this embodiment, the shaft 200 is actively cooled using a fan 320. The fan 320 blows cooling gas such as air, which may be at room temperature, at a flow rate of up to 10 m/s toward the shaft 200. In some embodiments, such as that shown in FIG. 3D, instead of a fan blowing cooling gas, the shaft 200 is cooled by a cooling gas flowing from a tube or several tubes 340 in the direction of the shaft 200, and the cooling gas is collected by an exhaust port or several exhaust ports 341. The exhaust ports 341 may include one or more pumps to draw the cooling gas past the shaft 200. This design enables more cooling gas flow which in turn increases the cooling power. In both embodiments, a cooling gas is flowed past the exterior of the shaft 200. In these embodiments, the shaft

200 may be aluminum, tungsten, stainless steel, or a different metallic alloy, or another material. In another embodiment, the shaft 200 may be copper, due to its superior thermal conductivity. In this embodiment, a sheath 201, made of a non-copper material, may be disposed on the outer surface of the shaft 200. Note that, in some embodiments, the sheath 201 extends the entire length of the shaft 200. In other embodiments, the sheath 201 may only be applied to the portion of the shaft 200 that is disposed within the cavity 196. The sheath 201 may be roughly 1 mm in thickness, and may be made from tungsten or another non-copper material. Note that the sheath 201 may also be applied if metals other than copper are used for the shaft 200. Further, this sheath 201 may also be employed in the embodiments shown in FIGS. 3A, 3B, 3E, 3F and 3G, if desired.

To further enhance heat transfer, the portion of the shaft 200 toward which the air is directed may include fins or other structures to increase its surface area.

Figure 3E:
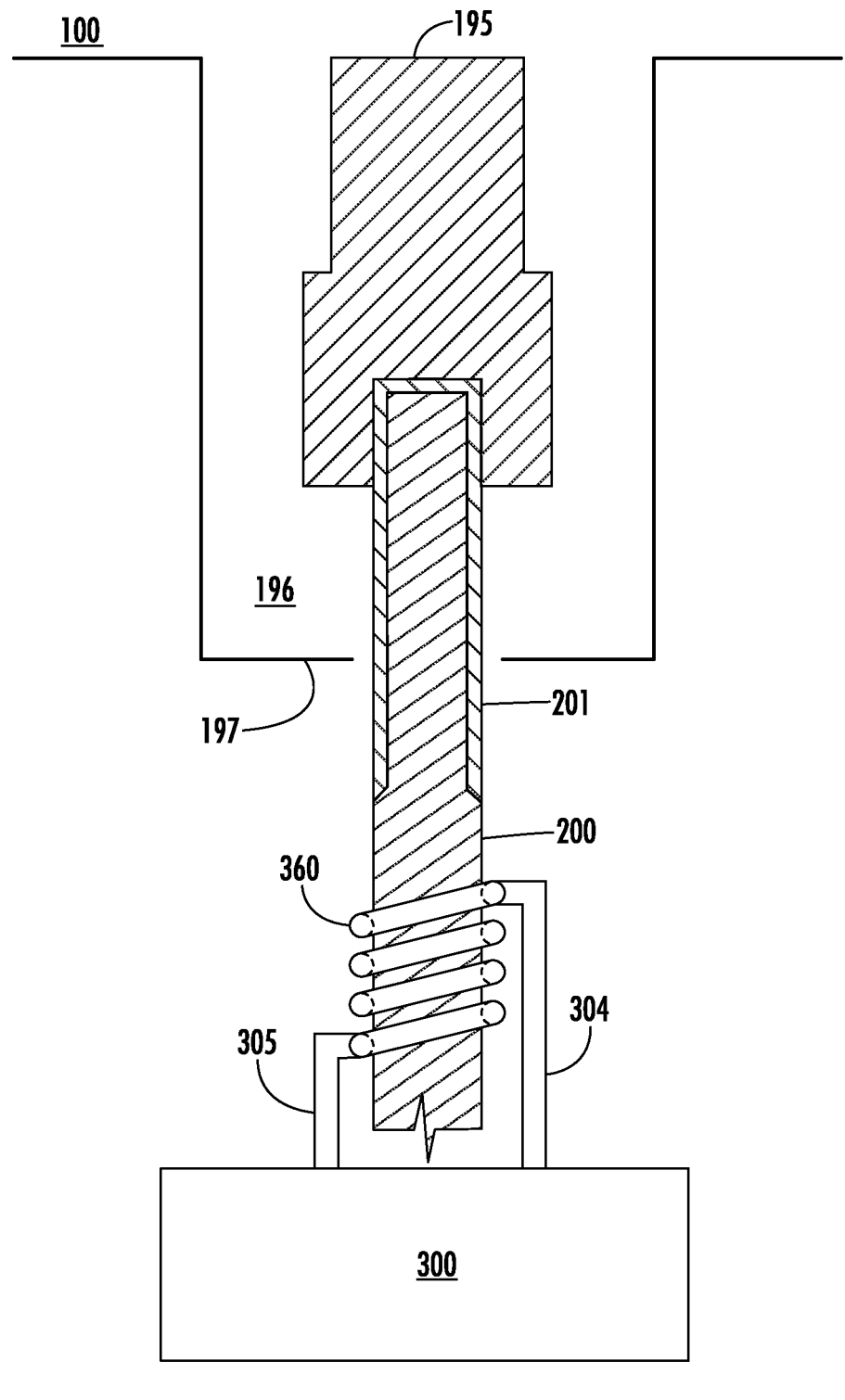

There are other cooling systems 215 that may be used to cool the exterior of the shaft 200. For example, FIG. 3E shows an embodiment where a cooling tube 360 is wrapped around the second portion of the shaft 200, wherein the second portion is located in the atmospheric environment. The cooling tube 360 may be in fluid communication with conduits 304, 305, which connect the cooling tube 360 to the fluid chiller 300. A cooling fluid may pass through this cooling tube 360, so as to cool the shaft 200. In some embodiments, the cooling fluid may be a gas. Alternatively, the cooling fluid may be a liquid.

In some embodiments, the conduits 304, 305 and the cooling tube 360 are fixed in place, such that the shaft 200 slides relative to the cooling tube 360. Thus, the section of the shaft 200 in contact with the cooling tube 360 changes based on the position of the target holder 190. In another embodiment, the cooling tube 360 may be affixed to the shaft 200, and thermally coupled by an interface medium such as by thermal paste. In this embodiment, the conduits 304, 305 may be flexible so as to allow the cooling tube 360 to be translated while the fluid chiller 300 remains stationary.

Figure 3F:
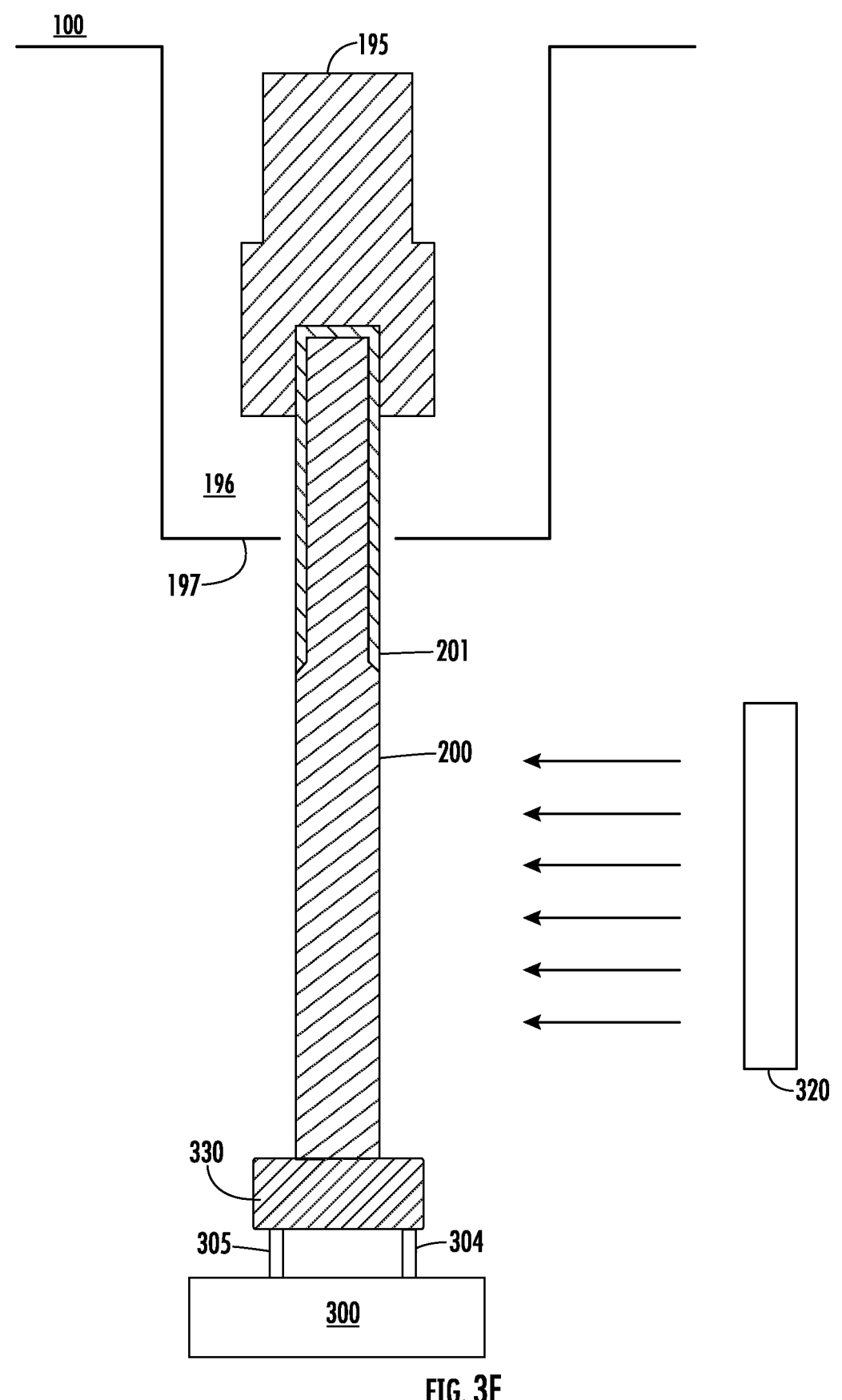

FIG. 3F shows another embodiment of the cooling system 215. In this embodiment, a cooling plate 330 is affixed to the proximal end of the shaft 200. Note that, in this embodiment, the actuator 210 may linearly translate the cooling plate 330 as well as the shaft 200. This cooling plate 330 may serve as a heat sink and may be maintained within a predetermined temperature range. For example, channels may be disposed in the cooling plate 330 such that a cooling fluid may flow through the cooling plate 330, maintaining it within the predetermined temperature range. This cooling fluid may be deionized water or a cooled gas, such as nitrogen or air. The conduits 304, 305 that connect the fluid chiller 300 to the channels in the cooling plate 330 may be flexible such that they are capable of expanding and contracting as the cooling plate 330 and the shaft 200 are translated toward and away from the arc chamber 100. In certain embodiments, this shaft 200 is further cooled through use of fan 320, which provides air cooling. In other embodiments, the fan 320 may not be present. In certain embodiments, this shaft 200 is further cooled through use of a tube 340 with complementary exhaust port 341. In some embodiments, the cooling plate 330 is also located around part of the shaft 200, thus increasing the contact area and efficiency of the cooling, while not interfering with the movement of the shaft 200.

Thus, FIGS. 3A-3F show several embodiments of a cooling system 215 that may be used to cool the shaft 200, including flowing a fluid over the exterior of the shaft 200, such as by gas cooling (FIG. 3C) or a cooling tube (FIGS. 3D-3E), flowing a cooling fluid through an interior of the shaft 200, using channels in the shaft 200 (FIG. 3A-3B) and attachment of a cooling plate 330 affixed to the proximal end of the shaft 200 (FIG. 3F). Note that for each of these embodiments, the means for cooling is disposed in an atmospheric environment.

Figure 3G:
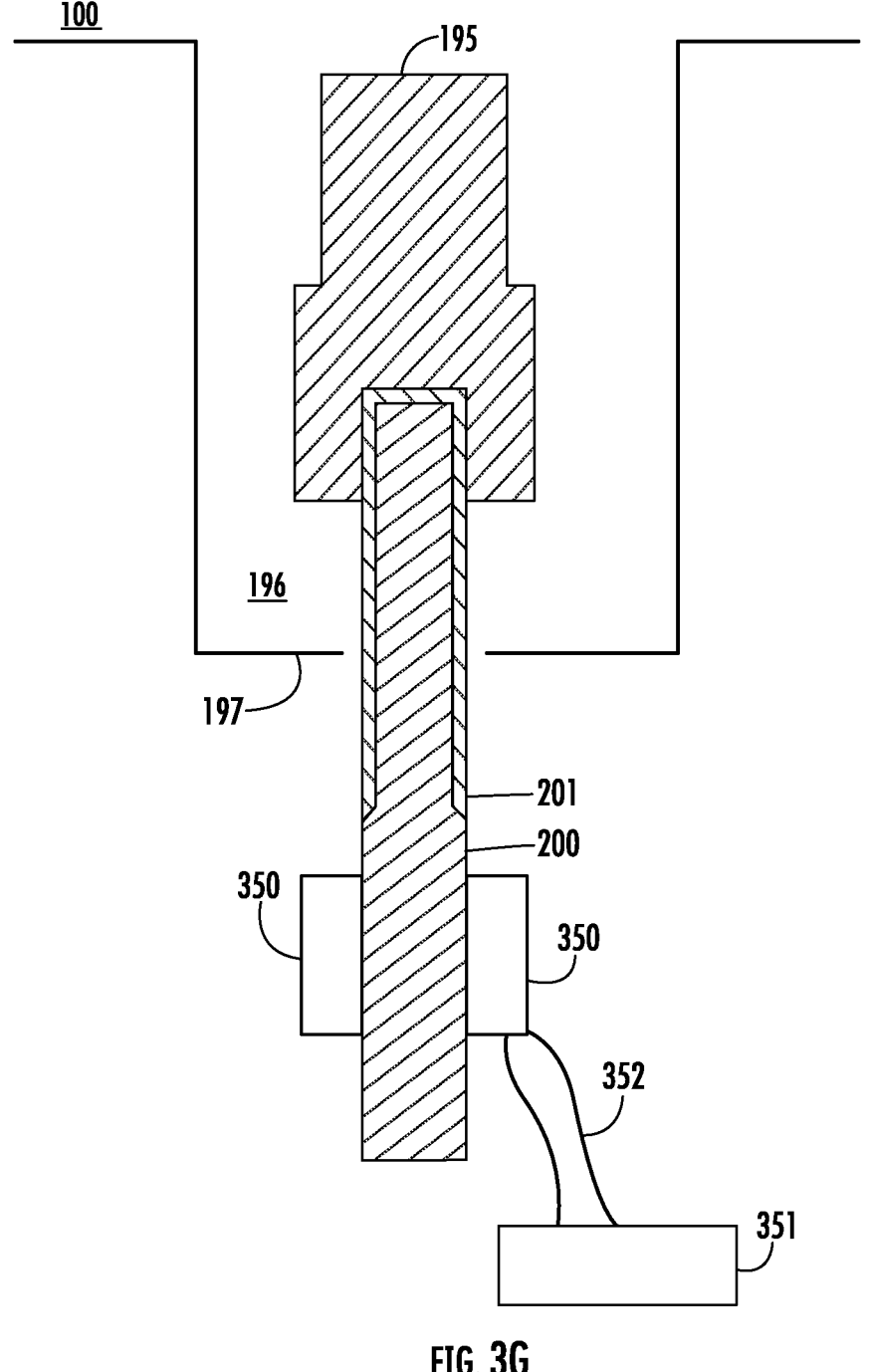

However, other techniques may be used to cool the shaft 200 as well. For example, as shown in FIG. 3G, thermo-electric cooling, such as through the use of heat pumps 350, which may be Peltier heat pumps, may also be used to cool the shaft 200. In some embodiments, the heat pumps 350 encircle the shaft 200. In other embodiments, the heat pumps 350 are placed at various locations along the shaft 200. The heat pumps 350 may be connected to a heat pump power supply 351 through use of wires 352. These wires 352 may be sufficiently long such that the heat pumps 350 can move with the shaft 200. The thermoelectric cooling can be implemented around the shaft 200, at the proximal end of the shaft 200, at or close to the target holder 190, or a combi-nation thereof. In some embodiments, the use of a thermosy-phon or heat pipe in, or attached to, the shaft 200 is used, with the appropriate combination of materials, such as copper and water.

Figure 4:
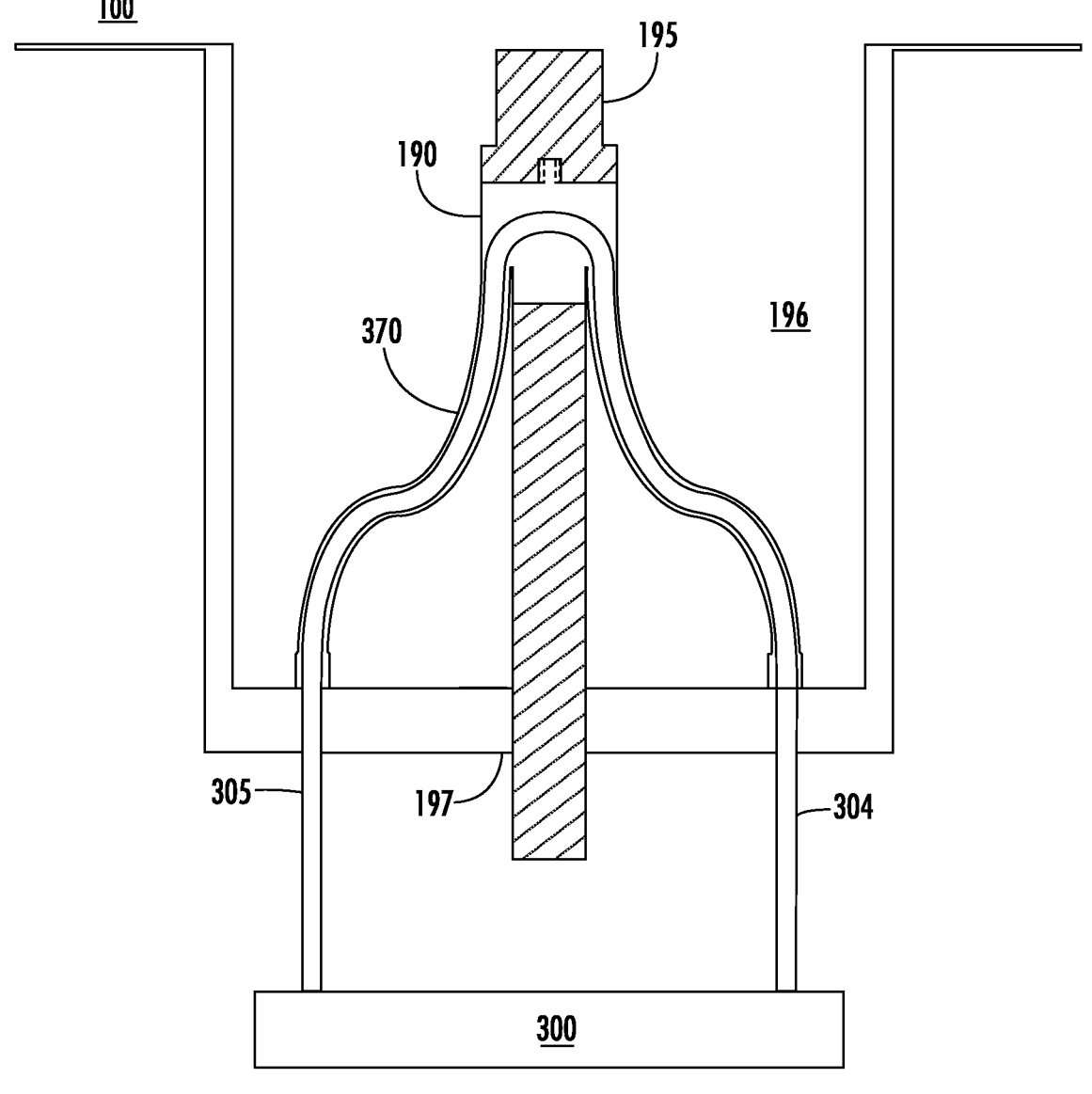
FIG. 4 shows a cooling system to cool the target holder.

In some embodiments, the cooling of the solid dopant material 195 is achieved by directly cooling the target holder 190. FIG. 4 shows one such embodiment. In this embodi-ment, the conduits 304, 305 pass through the vacuum seal 197 and are located within the cavity 196. These conduits 304, 305 bring cooling fluid directly to the target holder 190. There may be channels within the target holder that allow the cooling fluid to pass through the interior of the target holder 190. In certain embodiments, bellows 370 may be used to isolate the conduits 304, 305 from the conditions within the arc chamber 100.

In another embodiment, the heat pumps 350 of FIG. 3G are placed at or near the target holder. Note that if the heat pumps 350 are placed near the target holder 190, the wires 352 pass through the vacuum seal 197 and into the cavity 196. The amount of wire 352 disposed within the cavity 196 may be such that the wires 352 are affixed in place at the vacuum seal 197, such that there is no relative movement between the wires 352 and the vacuum seal 197, even as the shaft 200 is translated. As shown in FIG. 4, bellows 370 may be used to protect the wires 352. Alternatively, protective cladding may be disposed around the wires 352.

This embodiment simplifies the design of the shaft 200 at the expense of using flexible bellows to cool down target holder 190. The temperature control and other features of the design are similar to those described herein.

Thus, in each of these embodiments, there is a cooling system 215 that serves to cool the solid dopant material 195. In some embodiments, this cooling system 215 is configured to cool the shaft 200, while in other embodiment, the cooling system 215 is configured to cool the target holder. However, in all embodiments, the solid dopant material is actively cooled by the cooling system 215.

In some embodiments, the amount of cooling provided by the cooling system 215 to the shaft 200 and/or target holder 190 may be predetermined or established based on one or more parameters. For example, in the embodiments shown in FIGS. 3A-3B and 4, the flow rate of the cooling fluid through the shaft 200 or target holder 190 may be fixed. In other embodiments, the flow rate may be set based on a desired temperature range of the solid dopant material 195, the power applied to the cathode 110, the magnetic field power, the desired beam current and/or other parameters. In some embodiments, the speed of the fan 320 (see FIG. 3C), or the flow of the cooling gas in the tube 340 (see FIG. 3D), may be fixed. In other embodiments, the speed of the fan 320, or the flow of the cooling gas in the tube 340, may be set based on a desired temperature range of the solid dopant material 195, the power applied to the cathode 110, the magnetic field power, the desired beam current and/or other parameters. Similarly, the flow rate of cooling fluid passing through the cooling tube 360 in FIG. 3E and the cooling plate 330 in FIG. 3F may be fixed or may be set based on a desired temperature range of the solid dopant material 195, the power applied to the cathode 110, the magnetic field power, the desired beam current and/or other parameters. Likewise, the power applied to the heat pumps 350 in FIG. 3G may be similarly controlled.

However, in other embodiments, closed loop control may be employed. As noted above, in some embodiments, there may be a thermocouple 198 in communication with the shaft 200 or the target holder 190. The output of this thermocouple 198 may be used by the controller 180 to control the speed of the fan 320, the flow of the cooling gas in the tube 340, the flow rate of cooling fluid through the shaft 200 or target holder 190, the flow rate of cooling fluid through the cooling tube 360 or the cooling plate 330, or the power supplied to the heat pumps 350 so as to achieve a desired temperature range of the solid dopant material 195.

While the above disclosure describes the cooling of a target holder and/or a shaft in an indirectly heated cathode ion source, the disclosure is not limited to this embodiment. The cooling system 215 may also be employed in other ion or plasma sources, such as capacitively coupled plasma sources, inductively coupled plasma sources, a Bernas source or another suitable source.

Figure 5:
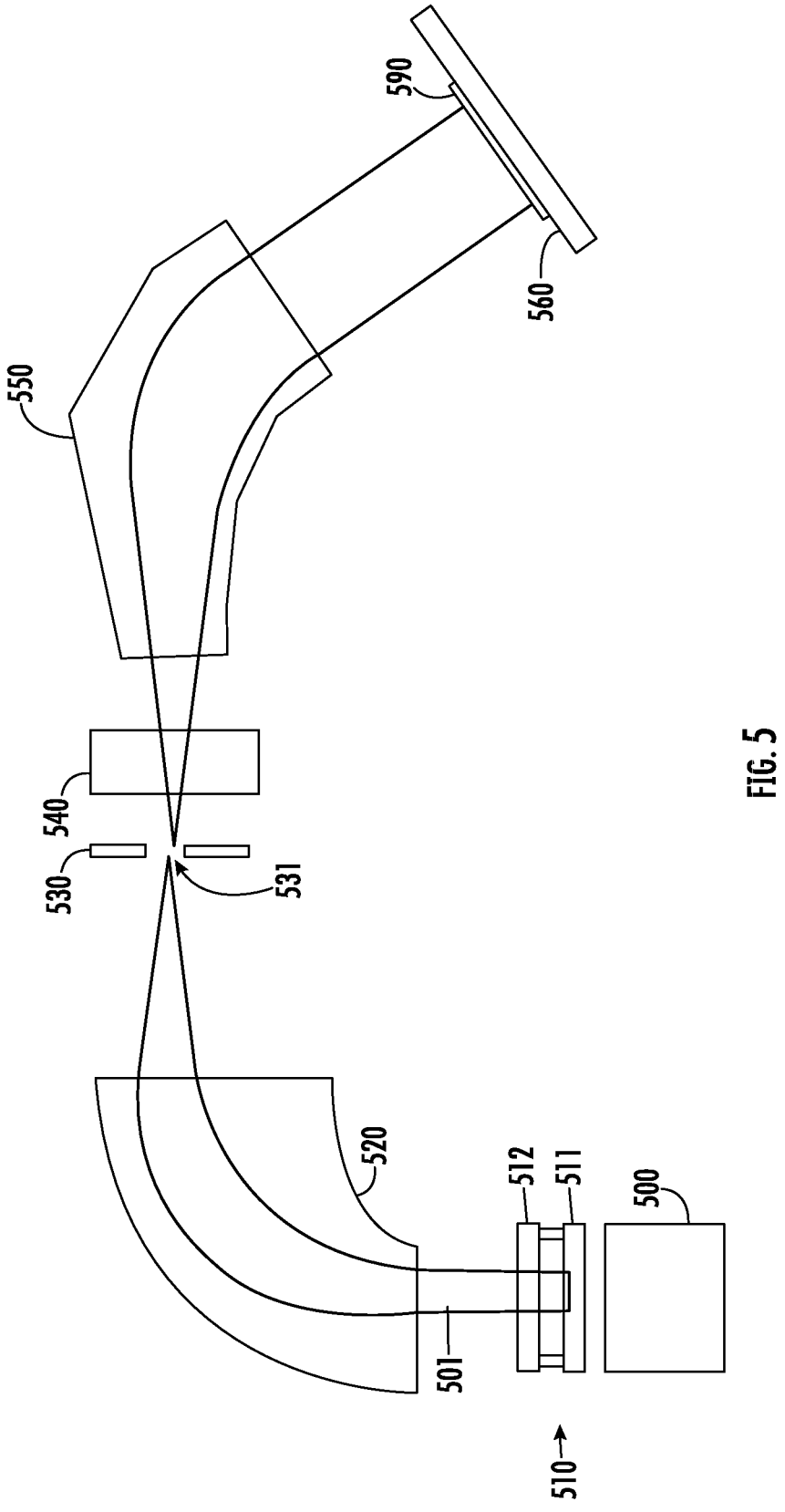
FIG. 5 shows an ion implanter that may utilize any of the ion sources described herein.

FIG. 5 shows an ion implanter that may utilize any of the ion sources described herein. The ion implanter includes an ion source 500, which may be any of the ion sources described above. As noted above, in certain embodiments, the ion source 500 may be an IHC ion source. In another embodiment, the ion source 500 may be an RF ion source. In this embodiment, an RF antenna may be disposed against a dielectric window. This dielectric window may comprise part or all of one of the chamber walls. The RF antenna may comprise an electrically conductive material, such as copper. An RF power supply is in electrical communication with the RF antenna. The RF power supply may supply an RF voltage to the RF antenna. The power supplied by the RF power supply may be between 0.1 and 10 kW and may be any suitable frequency, such as between 1 and 100 MHz. Further, the power supplied by the RF power supply may be pulsed. Other embodiments are also possible. For example, the plasma may be generated in a different manner, such as by a Bernas ion source, a capacitively coupled plasma (CCP) source, microwave or ECR (electron-cyclotron-resonance) ion source. The manner in which the plasma is generated is not limited by this disclosure.

One chamber wall, referred to as the extraction plate, includes an extraction aperture. The extraction aperture may be an opening through which the ions 501 generated in the ion source chamber are extracted and directed toward a workpiece 590. The extraction aperture may be any suitable shape. In certain embodiments, the extraction aperture may be oval or rectangular shaped.

Disposed outside and proximate the extraction aperture of the ion source 500 are extraction optics 510. In certain embodiments, the extraction optics 510 comprise one or more electrodes. In certain embodiments, the extraction optics 510 comprises a suppression electrode 511, which is negatively biased relative to the plasma so as to attract ions through the extraction aperture. The suppression electrode 511 may be electrically biased using a suppression power supply. The suppression electrode 511 may be biased so as to be more negative than the extraction plate of the ion source 500.

In some embodiments, the extraction optics 510 includes a second electrode 512. The second electrode 512 may be disposed proximate the suppression electrode 511. The second electrode 512 may be electrically connected to a second electrode power supply. In other embodiments, the second electrode 512 may be electrically grounded so that the second electrode power supply is not used.

In other embodiments, the extraction optics 510 may comprise in excess of two electrodes, such as three electrodes or four electrodes. In these embodiments, the electrodes may be functionally and structurally similar to those described above, but may be biased at different voltages.

Located downstream from the extraction optics 510 is a mass analyzer 520. The mass analyzer 520 uses magnetic fields to guide the path of the extracted ions 501. The magnetic fields affect the flight path of ions according to their mass and charge. A mass resolving device 530 that has a resolving aperture 531 is disposed at the output, or distal end, of the mass analyzer 520. By proper selection of the magnetic fields, only those ions 501 that have a selected mass and charge will be directed through the resolving aperture 531. Other ions will strike the mass resolving device 530 or a wall of the mass analyzer 520 and will not travel any further in the system.

One or more beamline components may be disposed downstream from the mass resolving device 530. For example, a collimator 540 may be disposed downstream from the mass resolving device 530. The collimator 540 accepts the extracted ions 501 that pass through the resolving aperture 531 and creates a ribbon ion beam formed of a plurality of parallel or nearly parallel beamlets. In other embodiments, the ion beam may be a spot beam. In this embodiment, an electrostatic scanner is used to move the spot beam in the first direction, as defined below.

Located downstream from the collimator 540 may be an acceleration/deceleration stage 550. The acceleration/deceleration stage 550 may be an electrostatic filter. The electrostatic filter is a beam-line lens component configured to independently control deflection, deceleration, and focus of the ion beam. Located downstream from the acceleration/deceleration stage 550 is the workpiece holder 560.

The workpiece 590, which may be, for example, a silicon wafer, a silicon carbide wafer, or a gallium nitride wafer, is disposed on the workpiece holder 560.

The embodiments described above in the present application may have many advantages. Aluminum has a melting temperature of approximately 660° C., which may be reached within an arc chamber 100. By actively cooling the shaft 200 and/or the target holder 190, the temperature of the solid dopant material 195 may be controlled. In some simulations, the temperature of the solid dopant material reached a maximum temperature of less than 400° C., with a plasma power of 800 W. This maximum temperature can be further reduced through the choice of the cooling system and shaft material. Thus, it is possible to insert a solid dopant material 195 into the arc chamber 100 and reduce or eliminate the possibility of melting through the use of active cooling.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion source for generating an ion beam, comprising:
an arc chamber, comprising a plurality of walls connecting a first end and a second end;
a target holder to hold a solid dopant material;
a shaft connected to the target holder, to extend the target holder into the arc chamber, such that, when extended, the solid dopant material is exposed to a plasma in the arc chamber;
a vacuum seal to divide the shaft into two portions, such that the target holder and a first portion of the shaft are in communication with the arc chamber and a second portion is disposed in an atmospheric environment; and
a cooling system to actively cool the solid dopant material.

2. The ion source of claim 1, wherein the cooling system actively cools the shaft.

3. The ion source of claim 2, wherein the shaft is made from copper and at least a portion of the shaft is covered by a sheath, made of a non-copper material.

4. The ion source of claim 2, wherein the shaft is cooled using a cooling fluid.

5. The ion source of claim 4, wherein the shaft includes a hollow cavity comprising an inlet channel and an outlet channel, such that the cooling fluid flows through an interior of the shaft.

6. The ion source of claim 5, wherein a partition is located within the hollow cavity and separates the inlet channel from the outlet channel.

7. The ion source of claim 5, wherein the shaft includes two tubes, wherein the hollow cavity defines an outer tube, and an inner tube is disposed within the outer tube and does not extend to a distal end of the shaft, wherein the two tubes form the inlet channel and the outlet channel.

8. The ion source of claim 2, wherein the shaft is cooled by flowing a cooling gas toward an exterior of the shaft.

9. The ion source of claim 2, further comprising a cooling tube, in fluid communication with a fluid chiller, wherein the cooling tube is wrapped around a portion of the shaft.

10. The ion source of claim 2, further comprising a cooling plate affixed to a proximal end of the shaft, wherein the cooling plate serves as a heat sink.

11. The ion source of claim 10, wherein channels are disposed in the cooling plate and cooling fluid flows through the cooling plate to maintain the cooling plate within a predetermined temperature range.

12. The ion source of claim 1, wherein the shaft and/or the target holder is actively cooled using heat pumps affixed thereto.

13. The ion source of claim 1, wherein the target holder is actively cooled using a cooling fluid that passes through the target holder.

14. An ion implanter, comprising:

an ion source to generate an ion beam; and one or more beamline components to direct the ion beam toward a workpiece, wherein the ion source comprises:

an arc chamber, comprising a plurality of walls connecting a first end and a second end;

a target holder to hold a solid dopant material;

a shaft connected to the target holder, to extend the target holder into the arc chamber, such that, when extended, the solid dopant material is exposed to a plasma in the arc chamber;

a vacuum seal to divide the shaft into two portions, such that the target holder and a first portion of the shaft are in communication with the arc chamber and a second portion is disposed in an atmospheric environment; and a cooling system to actively cool the solid dopant material.

15. The ion implanter of claim 14, further comprising:

a thermocouple to measure a temperature of the solid dopant material; and a controller, wherein the controller uses information from the thermocouple to maintain the solid dopant material within a desired temperature range.

16. The ion implanter of claim 15, wherein the controller actively cools the shaft to maintain the solid dopant material within the desired temperature range.

17. The ion implanter of claim 15, wherein the shaft is cooled by a fluid passing through an interior of the shaft or a fluid passing over an exterior of the shaft, wherein the controller controls a temperature of the solid dopant material by controlling a rate of flow of the fluid.

18. The ion implanter of claim 15, wherein the shaft is cooled by attachment of a cooling plate to a proximal end of the shaft, wherein the controller controls a temperature of the solid dopant material by controlling a temperature of the cooling plate.

19. The ion implanter of claim 15, wherein the shaft and/or target holder is cooled by attachment of one or more heat pumps, wherein the controller controls a temperature of the solid dopant material by controlling power supplied to the one or more heat pumps.

20. The ion implanter of claim 15, wherein the target holder is cooled by a fluid passing through an interior of the target holder, wherein the controller controls a temperature of the solid dopant material by controlling a rate of flow of the fluid.

\* \* \* \* \*